(12) United States Patent
Kim (10) Patent No.: US 10,466,267 B2
(45) Date of Patent: Nov. 5, 2019

(54) SENSOR

(71) Applicants: SPHEREDYNE CO., LTD., Seoul (KR); Sug Whan Kim, Gimpo-si, Gyeonggi-do (KR)

(72) Inventor: Sug Whan Kim, Gimpo-si (KR)

(73) Assignee: SPHEREDYNE CO., LTD., Seoul (KR)

( * ) Notice: Subject to any disclaimer, the term of this patent is extended or adjusted under 35 U.S.C. 154(b) by 129 days.

(21) Appl. No.: 15/532,711

(22) PCT Filed: Dec. 2, 2015

(86) PCT No.: PCT/KR2015/013047
§ 371 (c)(1),
(2) Date: Jun. 2, 2017

(87) PCT Pub. No.: WO2016/089107
PCT Pub. Date: Jun. 9, 2016

(65) Prior Publication Data
US 2018/0038885 A1      Feb. 8, 2018

(30) Foreign Application Priority Data

Dec. 2, 2014   (KR) ........................ 10-2014-0170741
Jun. 22, 2015  (KR) ........................ 10-2015-0088706

(51) Int. Cl.
*G01P 15/09*     (2006.01)
*F02D 41/20*     (2006.01)
(Continued)

(52) U.S. Cl.
CPC .............. *G01P 15/09* (2013.01); *F02D 41/20* (2013.01); *G01C 21/16* (2013.01); *G01D 11/245* (2013.01);
(Continued)

(58) Field of Classification Search
CPC ......... H05K 2201/0151; G01D 11/245; G01C 21/16; F02D 41/20; G01P 15/0802;
(Continued)

(56) References Cited

U.S. PATENT DOCUMENTS 5,528,937 A  *  6/1996  Dufour ................. G01P 15/125
                                                            73/514.32
2001/0050568 A1    12/2001  Ahmad et al.
(Continued)

FOREIGN PATENT DOCUMENTS

JP        07014382 U       3/1995
JP        2000199714 A     7/2000
(Continued)

OTHER PUBLICATIONS

Office Action dated Apr. 29, 2016 of the Korean Patent Application No. 10-2015-0088706.
(Continued)

*Primary Examiner* — Peter J Macchiarolo
*Assistant Examiner* — Irving A Campbell
(74) *Attorney, Agent, or Firm* — Nixon Peabody LLP; Jeffrey L. Costellia (57) ABSTRACT

The present invention provides a sensor with a simple structure which can precisely sense movement, etc., the sensor comprising: a head; and a support which is disposed to support one side of the head, wherein the support comprises: a first support portion for supporting the head; a second support portion which supports the head and is spaced apart from the first support portion; a first extension portion which is extended from the first support portion; a second extension portion which is extended from the second support portion; and a sensing portion which senses the deformation of the first extension portion and the second extension portion.

24 Claims, 7 Drawing Sheets

(51) Int. Cl.
*G01C 21/16* (2006.01)
*G01D 11/24* (2006.01)
*G01P 15/08* (2006.01)
*G01P 15/12* (2006.01)
*G01P 15/18* (2013.01)
*G01P 15/125* (2006.01)

(52) U.S. Cl.
CPC ........ *G01P 15/0802* (2013.01); *G01P 15/123* (2013.01); *G01P 15/125* (2013.01); *G01P 15/18* (2013.01); *H05K 2201/10151* (2013.01)

(58) Field of Classification Search
CPC ...... G01P 15/09; G01P 15/123; G01P 15/125; G01P 15/18; G01P 2015/084; G01P 2015/0842; G01P 2015/0857
USPC .......................................... 73/514.31–514.33
See application file for complete search history.

(56) References Cited

U.S. PATENT DOCUMENTS

2006/0065054 A1* 3/2006 Ikeda .................. G01P 15/0802
73/514.34
2013/0014586 A1 1/2013 Walling et al.

FOREIGN PATENT DOCUMENTS

| JP | 2007187463 A | 7/2007 |
| JP | 2009270961 A | 11/2009 |
| KR | 1020060051633 A | 5/2006 |
| KR | 1020120129650 A | 11/2012 |

OTHER PUBLICATIONS

International Search Report dated Apr. 27, 2016 of International Application No. PCT/KR2015/013047.

* cited by examiner

SENSOR

CROSS-REFERENCE TO RELATED APPLICATIONS

This application is the U.S. national phase of PCT International Patent Application No. PCT/KR2015/013047, filed Dec. 2, 2015, which claims the benefit of Korean Patent Application Nos. 10-2014-0170741, filed Dec. 2, 2014 and 10-2015-0088706, filed Jun. 22, 2015, the contents of which are incorporated by reference herein in their entirety.

TECHNICAL FIELD

The present disclosure relates to a sensor, and more particularly, to a sensor having a simple structure and capable of precisely sensing motions.

BACKGROUND ART

In general, a sensor senses changes in a pre-set environment. Particularly, an acceleration sensor can measure a dynamic force of an object, such as acceleration, a vibration, or an impact. A typical acceleration sensor uses a method of measuring an electromotive force generated by a magnet and a coil (Korean Utility-model Application Publication No. 1999-0021386).

DETAILED DESCRIPTION OF THE INVENTION

Technical Problem

However, a typical acceleration sensor has a complicated structure or may sense acceleration with low precision.

The present disclosure is aimed at overcoming various problems including the above-described problems, and to provide a sensor having a simple structure and capable of precisely sensing motion. However, these problems are only examples, and the range of the present disclosure is not limited to overcoming these problems.

Technical Solution

According to an aspect of the present disclosure, there is provided a sensor including: a head; and a support disposed to support one side of the head, wherein the support includes: a first support portion supporting the head; a second support portion supporting the head and spaced apart from the first support portion; a first extension portion extending from the first support portion; a second extension portion extending from the second support portion; and a sensing portion configured to sense deformation of the first extension portion and the second extension portion.

At least one of the first extension portion and the second extension portion may include a conductive material, and the sensing portion may consider the at least one of the first extension portion and the second extension portion including the conductive material as an electrode for sensing a change in capacitance, thereby sensing a change in distance between the first extension portion and the second extension portion.

At least one of the first extension portion and the second extension portion may include a conductive material and may be connected to a coil, and the sensing portion may sense a change in inductance of the coil to sense a change in distance between the first extension portion and the second extension portion.

The sensing portion may include: a voltage applying portion configured to apply an alternating-current voltage between the first extension portion and the second extension portion; and a current measuring portion configured to measure current flowing between the first extension portion and the second extension portion.

The sensing portion may include a strain gauge. More specifically, the sensing portion may include a first strain gauge disposed on the first extension portion, and a second strain gauge disposed on the second extension portion.

The sensing portion may include: a piezoelectric device interposed between the first extension portion and the second extension portion, between the first support portion and the head, or between the second support portion and the head; and a voltage measuring portion configured to measure a voltage generated by the piezoelectric device.

The head may include a non-conductive material. Alternatively, at least a part of a surface of the head may be coated with a non-conductive material.

The support may be flexible.

A distance between the first support portion and the second support portion may be shorter than a thickness of a thickest portion of the head.

The sensor may include a plurality of supports, wherein the plurality of supports may contact the head at different locations to support the head. In this case, the sensor may further include a hollow receptor, wherein each of the plurality of supports may be fixed on an inner surface of the receptor.

According to another aspect of the present disclosure, there is provided a sensor including: a head; and a plurality of supports contacting the head at different locations and supporting the head, wherein each of the plurality of supports includes: a support portion supporting the head; an extension portion extending from the support portion; and a sensing portion configured to sense deformation of the extension portion, wherein the extension portions of the plurality of supports extend in different directions.

The sensing portion may include a strain gauge disposed on the extension portion, or a piezoelectric device interposed between the head and the support portion.

The plurality of supports may be flexible.

The sensor may further include a hollow receptor, wherein each of the plurality of supports may be fixed on an inner surface of the receptor.

The sensing portion may consider the plurality of supports and at least a part of the inner surface of the receptor as electrodes to sense a change in capacitance, thereby sensing deformation of the extension portion.

The plurality of supports may be connected to the inner surface of the receptor by a coil, and the sensing portion may sense a change in inductance of the coil to sense deformation of the extension portion.

According to another aspect of the present disclosure, there is provided a sensor including: a head; and a support disposed to support one side of the head, wherein the support includes: a support portion supporting the head; a frame spaced apart from the support portion; a plurality of connecting portions connecting the support portion to the frame, the connecting portions being flexible; and a sensing portion configured to sense deformation of the plurality of connecting portions.

The sensing portion may include a strain gauge disposed on the plurality of connecting portions, or a piezoelectric device interposed between the head and the support portion.

The sensor may further include a plurality of supports, wherein the plurality of supports may contact the head at different locations to support the head.

The sensor may further include a hollow receptor, wherein each of the plurality of supports may be fixed on an inner surface of the receptor.

The sensing portion may consider the plurality of supports and at least a part of the inner surface of the receptor as electrodes to sense a change in capacitance, thereby sensing deformation of the plurality of connecting portions.

The plurality of supports may be connected to the inner surface of the receptor by a coil, and the sensing portion may sense a change in inductance of the coil to sense deformation of the plurality of connecting portions.

Each of the support portion and the frame may be in the form of a closed loop.

According to another aspect of the present disclosure, there is provided a sensor including: a head; and a support disposed to support one side of the head, wherein the support includes: a support portion supporting the head; a frame which is flexible and contacting the support portion; and a sensing portion configured to sense deformation of the frame.

The sensing portion may include a strain gauge disposed on the frame, or a piezoelectric device interposed between the head and the support.

The sensor may include a plurality of supports, wherein the plurality of supports may contact the head at different locations to support the head. Also, the sensor may further include a hollow receptor, wherein each of the plurality of supports may be fixed on an inner surface of the receptor.

The sensing portion may consider the plurality of supports and at least a part of the inner surface of the receptor as electrodes to sense a change in capacitance, thereby sensing deformation of the frame.

The plurality of supports may be connected to the inner surface of the receptor by a coil, and the sensing portion may sense a change in inductance of the coil to sense deformation of the frame.

Advantageous Effects of the Invention

According to an embodiment of the present disclosure configured as described above, a sensor having a simple structure and capable of precisely sensing motion can be implemented. However, the range of the present disclosure is not limited to these effects.

BEST MODE

Hereinafter, embodiments of the present disclosure will be described in detail with reference to the accompanying drawings. However, the present disclosure may be embodied in different forms and should not be construed as limited to the embodiments set forth herein. Rather, these embodiments are provided so that the present disclosure will be thorough and complete, and will fully convey example implementations to those skilled in the art. Also, for convenience of description, components shown in the drawings may be exaggerated or reduced in size. For example, the sizes and thicknesses of the components shown in the drawings are represented arbitrarily for convenience of description, and the present disclosure is not necessarily limited to the shown examples.

In the following embodiments, an x-axis, a y-axis, and a z-axis are not limited to three axes on an orthogonal coordinates system, and may be analyzed in a broader sense including them. For example, the x-axis, the y-axis, and the z-axis may cross at right angles to each other, but may refer to different directions that do not cross at right angles to each other.

It will also be understood that when a component, such as a layer, a film, a region, a plate, etc., is referred to as being "on" another component, it can be directly on the other component, or intervening components may also be present.

Figure 1:
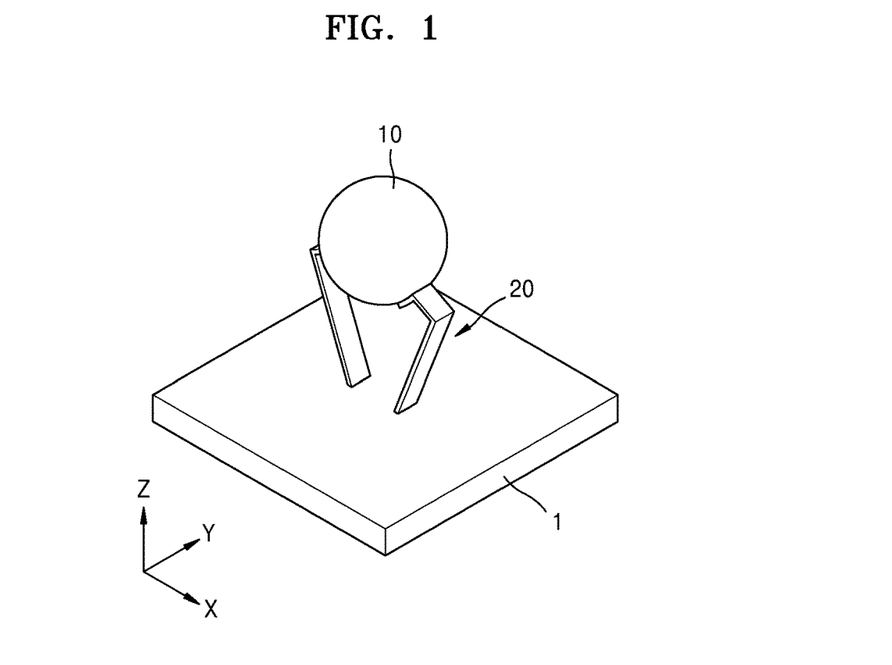
FIG. 1 is a perspective view schematically illustrating a sensor according to an embodiment of the present disclosure.
Figure 2:
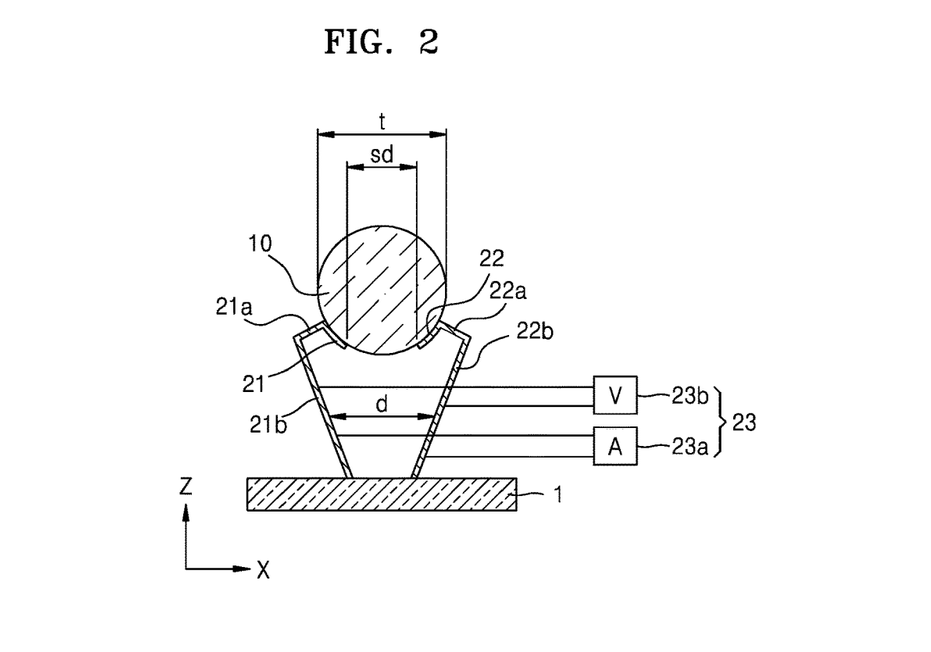
FIG. 2 is a cross-sectional view schematically illustrating a cross-section of the sensor of FIG. 1.

FIG. 1 is a perspective view schematically illustrating a sensor according to an embodiment of the present disclosure, and FIG. 2 is a cross-sectional view schematically illustrating the cross-section of the sensor of FIG. 1.

The sensor according to the current embodiment may include, as shown in FIGS. 1 and 2, a head 10 and a support 20 disposed to support one side of the head 10 (a part of the head 10 in a substantially negative (−) z direction in FIGS. 1 and 2).

The head 10 may be in the shape of a sphere, as shown in FIGS. 1 and 2. However, the present disclosure is not limited thereto, and the head 10 may be one of various shapes, such as a polyhedron, an ellipsoid, a hemisphere, or a hemiellipsoid. The head 10 may have sufficient mass to perform a motion from which acceleration can be detected or magnitude of acceleration can be measured, which will be described later. The support 20 may be disposed on a base 1 to support the head 10, as shown in FIG. 1. The support 20 may include a first support portion 21, a first extension portion 21*a*, a second support portion 22, a second extension portion 22*a*, and a sensing portion 23. Also, the sensor may include a plurality of supports 20 arranged radially with respect to the z-axis to support the head 10.

The first support portion 21 and the second support portion 22 may be spaced apart from each other to support the head 10. For this, the first support portion 21 and the second support portion 22 may have a concavo-convex form that corresponds to a shape of the surface of the head 10. Also, the first support portion 21 and the second support portion 22 may support the head 10 at two sides (negative (−) x direction side and positive (+) x direction side) with respect to the center of the head 10. Accordingly, the first support portion 21 may extend toward the negative (−) z direction in such a way as to be inclined in a direction toward the positive (+) x direction, and the second support portion 22 may extend toward the negative (−) z direction in such a way as to be inclined in a direction toward the negative (−) x direction, as shown in FIGS. 1 and 2. The first support portion 21 and the second support portion 22 may be in the form of a plate, and may be formed of a flexible material. The first support portion 21 and the second support portion 22 may be formed of a conductive metal and/or a synthetic resin. The first support portion 21 and the second support portion 22 may directly contact the head 10. However, a coating material, an insulating material, an adhesive, or a lubricant may be interposed between the first and second support portions 21 and 22 and the head 10.

A distance sd between the first support portion 21 and the second support portion 22 may be shorter than a thickness t of a thickest portion of the head 10. The distance sd between the first support portion 21 and the second support portion 22 may be a distance from an end of the first support portion 21 to the second support portion 22 and a distance from an end of the second support portion 22 to the first support portion 21. Also, the thickness t of the thickest portion of the head 10 may be the diameter of the head 10 when the head 10 is in the shape of a sphere. If the distance sd and the thickness t satisfy these conditions, the head 10 can be prevented from escaping toward the base 1 through space between the first support portion 21 and the second support portion 22, that is, from entering the inside of the support 20.

The first extension portion 21*a* may extend from the first support portion 21, and the second extension portion 22*a* may extend from the second support portion 22. Since the first support portion 21 and the second support portion 22 support the head 10 at two sides (negative (−) x direction side and positive (+) x direction side) with respect to the center of the head 10, the first extension portion 21*a* and the second extension portion 22*a* may be located at the two sides of the head with respect to the center of the head 10. Also, the first extension portion 21*a* and the second extension portion 22*a* may be inclined toward the base 1. Accordingly, the first extension portion 21*a* may extend toward the negative (−) z direction in such a way as to be inclined in the direction toward the negative (−) x direction, and the second extension portion 22*a* may extend toward the negative (−) z direction in such a way as to be inclined in the direction toward the positive (+) x direction. The first extension portion 21*a* and the second extension portion 22*a* may be in the form of a plate, and may be formed of a flexible material.

Also, the first extension portion 21*a* and the second extension portion 22*a* may be formed of a conductive metal and/or a synthetic resin.

The support 20 may further include a first additional extension portion 21*b* extending from the first extension portion 21*a* toward the base 1, and a second additional extension portion 22*b* extending from the second extension portion 22*a* toward the base 1, as shown in FIGS. 1 and 2. One end of the first additional extension portion 21*b* may be connected to the first extension portion 21*a*, and the other end of the first additional extension portion 21*b* may be connected to the base 1. One end of the second additional extension portion 22*b* may be connected to the second extension portion 22*a*, and the other end of the second additional extension portion 22*b* may be connected to the base 1. As a result, the support 20 can be positioned on the base 1. The first additional extension portion 21*b* and the second additional extension portion 22*b* may be in the form of a plate, and may be formed of a flexible material. Also, the first additional extension portion 21*b* and the second additional extension portion 22*b* may be formed of a metal and/or a synthetic resin.

A structure including the first extension portion 21*a* and the first additional extension portion 21*b* may also be collectively referred to as the first extension portion 21*a*, and a structure including the second extension portion 22*a* and the second additional extension portion 22*b* may also be collectively referred to as the second extension portion 22*a*. In this case, the first extension portion 21*a* and the second extension portion 22*a* may have a curved portion or a bent portion. Or, unlike FIGS. 1 and 2, the first extension portion 21*a* and the second extension portion 22*a* may be directly connected to the base 1 without having the first additional extension portion 21*b* and the second additional extension portion 22*b*. Hereinafter, for convenience of description, the first additional extension portion 21*b* is assumed to be a portion of the first extension portion 21*a*, and the second additional extension portion 22*b* is assumed to be a portion of the second extension portion 22*a*.

The sensing portion 23 may detect deformation of the first extension portion 21*a* and the second extension portion 22*a*. More specifically, if the sensor or an object mounted with the sensor undergoes an accelerated motion, the head 10 having sufficient mass may move in the opposite direction of acceleration due to inertia. Accordingly, since they are flexible, the first extension portion 21*a* and/or the second extension portion 22*a* may be deformed. For example, in the case of the sensor shown in FIGS. 1 and 2, if the sensor or an object mounted with the sensor undergoes an accelerated motion in the positive (+) z direction, the head 10 may move in the negative (−) z direction, and according to the movement of the head 10, the first extension portion 21*a* and/or the second extension portion 22*a*, which are flexible, may be deformed. The sensing portion 23 may sense the deformation. Accordingly, the sensor may sense acceleration and/or magnitude of acceleration. The first extension portion 21*a* and the second extension portion 22*a* may include the first additional extension portion 21*b* and the second additional extension portion 22*b*, respectively, as described above.

The sensing portion 23 may be implemented in various manners. For example, as shown in FIG. 2, the sensing portion 23 may be implemented by a method of sensing a change in capacitance. That is, the first extension portion 21*a* and the second extension portion 22*a* may each include a conductive material, and the sensing portion 23 may sense a change in capacitance between the first extension portion 21*a* and the second extension portion 22*a* to thus detect a change in distance between the first extension portion 21a and the second extension portion 22a.

For example, the sensing portion 23 may include a voltage applying portion 23b to apply an alternating-current voltage between the first extension portion 21a and the second extension portion 22a, and a current measuring portion 23a to measure current flowing between the first extension portion 21a and the second extension portion 22a. The first extension portion 21a and the second extension portion 22a may be considered to be an RC circuit in which a capacitor is connected to a resistor having predetermined resistance. Accordingly, magnitude and frequency of the alternating-current voltage applied by the voltage applying portion 23b, and magnitude of current measured by the current measuring portion 23a, may be used to calculate capacitance. For example, if the first extension portion 21a and the second extension portion 22a are considered to be a serial RC circuit, capacitance C may be calculated according to the following equation.

$$C = \frac{1}{\omega} \frac{I}{\sqrt{V^2 - I^2 R^2}}, \quad \text{[Equation 1]}$$

where ω is frequency of the alternating-current voltage, V is magnitude of the voltage, I is magnitude of the current, and R is resistance.

Since the calculated capacitance C changes according to a distance d between the first extension portion 21a and the second extension portion 22a, the distance d between the first extension portion 21a and the second extension portion 22a can be calculated. Generally, capacitance is inversely proportional to the distance d between two electrodes (in this case, the first extension portion 21a and the second extension portion 22a).

In the case of the sensor shown in FIGS. 1 and 2, if the sensor or an object mounted with the sensor undergoes an accelerated motion in the positive (+) z direction, the head 10 may move in the negative (−) z direction, and according to the movement of the head 10, the first extension portion 21a and the second extension portion 22a that are flexible may be deformed such that the distance d between the first extension portion 21a and the second extension portion 22a increases. By measuring the distance d, magnitude of acceleration can be precisely measured.

Objects between which capacitance is measured are not necessarily limited to the first extension portion 21a and the second extension portion 22a. For example, capacitance between the first extension portion 21a and the second support portion 22 may be measured, or capacitance between the second extension portion 22a and the first support portion 21 may be measured. That is, at least one of the first extension portion 21a and the second extension portion 22a may include a conductive material, and a capacitor of which an electrode is one of the first extension portion 21a and the second extension portion 22a including the conductive material is assumed. In this case, a change in capacitance of the capacitor may be sensed such that a change in distance between the first extension portion 21a and the second extension portion 22a may be sensed.

MODE OF THE INVENTION

Figure 3:
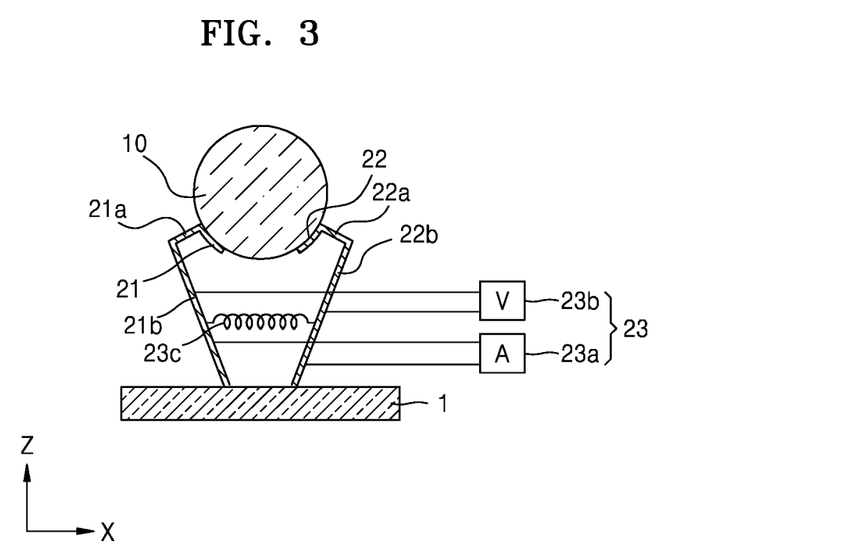
FIG. 3 is a cross-sectional view schematically illustrating a sensor according to another embodiment of the present disclosure.

However, the configuration of the sensing portion 23 is not limited to the above. For example, as shown in FIG. 3 which is a cross-sectional view schematically illustrating a sensor according to another embodiment of the present disclosure, the sensing portion 23 may include a conductive coil 23c or another conductive elastic object. In this case, the first extension portion 21a and the second extension portion 22a may each include a conductive material, and may be connected to the coil 23c. Also, the sensing portion 23 may sense a change in inductance between the first extension portion 21a and the second extension portion 22a to sense a change in distance between the first extension portion 21a and the second extension portion 22a.

More specifically, the first extension portion 21a and the second extension portion 22a may be considered to be an RL circuit in which an inductor is connected to a resistor having predetermined resistance. Accordingly, magnitude and frequency of an alternating-current voltage applied by the voltage applying portion 23b, and magnitude of current measured by the current measuring portion 23a, may be used to calculate inductance. For example, if the first extension portion 21a and the second extension portion 22a are considered to be a serial RL circuit, inductance L may be calculated by the following equation.

$$L = \frac{1}{\omega I} \sqrt{V^2 - I^2 R^2}, \quad \text{[Equation 2]}$$

where ω is frequency of the alternating-current voltage, V is magnitude of the voltage, I is magnitude of the current, and R is resistance.

Since the calculated inductance L changes according to a distance d between the first extension portion 21a and the second extension portion 22a, the distance d between the first extension portion 21a and the second extension portion 22a can be calculated. If the number of windings of the coil 23c is N, a cross-sectional area of the coil 23c is A, a length of the coil 23c is l, and permeability is $\mu_0$, inductance L may be expressed as the following equation.

$$L = \frac{\mu_0 N^2 A}{\ell} \quad \text{[Equation 3]}$$

Since the length l of the coil 23c is decided according to the distance d between the first extension portion 21a and the second extension portion 22a, inductance L calculated based on measured values can be understood to include data regarding the distance d between the first extension portion 21a and the second extension portion 22a.

The coil 23c may not necessarily be connected to the first extension portion 21a and the second extension portion 22a. For example, the coil 23c may be connected between the first extension portion 21a and the second support portion 22, or between the second extension portion 22a and the first support portion 21. That is, at least any one of the first extension portion 21a and the second extension portion 22a may include a conductive material, and be connected to the coil 23c. The sensing portion may sense a change in inductance of the coil 23c to sense a change in distance between the first extension portion 21a and the second extension portion 22a.

Figure 4:
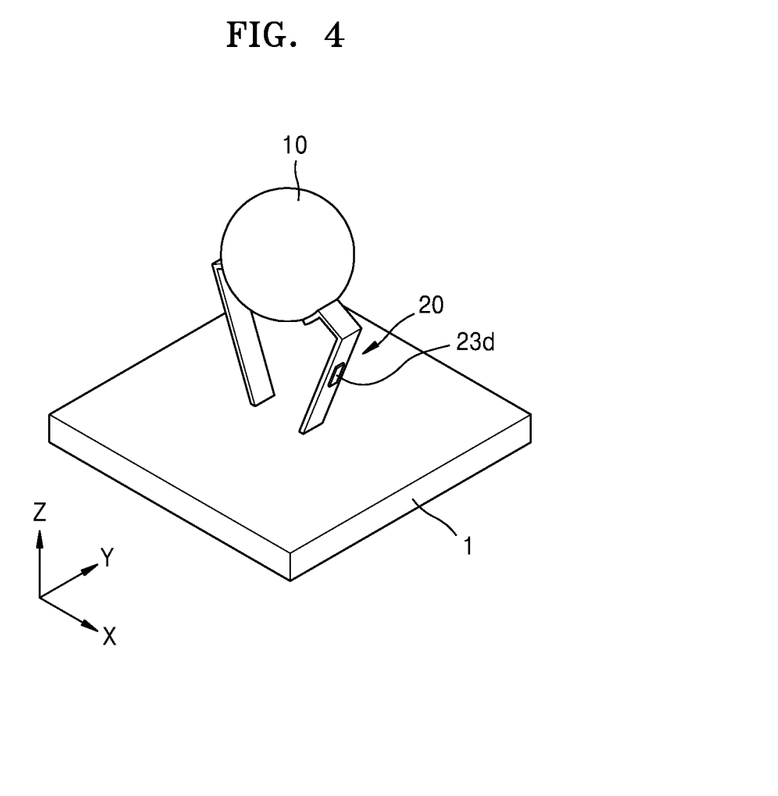
FIG. 4 is a perspective view schematically illustrating a sensor according to another embodiment of the present disclosure.

However, the configuration of the sensing portion 23 is not limited thereto. For example, as shown in FIG. 4 which is a cross-sectional view schematically illustrating a sensor according to another embodiment of the present disclosure, the sensing portion 23 may include a strain gauge 23d. More specifically, the sensing portion 23 may include a first strain gauge disposed on the first extension portion 21a, and a second strain gauge disposed on the second extension portion 22a.

The strain gauge 23d may be in the form of a thin film or a thin line formed of CuNi or NiCr. If the first extension portion 21a or the second extension portion 22a on which the strain gauge 23d is attached is deformed, the thin film or the thin line may stretch to change electrical resistance. Generally, if the thin film or the thin line stretches, resistance may increase, and if the thin film or the thin line relaxes, resistance may decrease. The change in resistance may be converted into a strain value called a gauge factor. The change in resistance may be measured generally by a Wheatstone bridge. By precisely measuring a degree of strain of the first extension portion 21a or the second extension portion 22a through the strain gauge 23d, it is possible to detect acceleration or to precisely measure magnitude of acceleration.

In the case of the sensor shown in FIG. 4, if the sensor or an object mounted with the sensor undergoes an accelerated motion in the positive (+) z direction, the head 10 may move in the negative (−) z direction, and according to the movement of the head 10, the first extension portion 21a and the second extension portion 22a that are flexible may be deformed such that the distance between the first extension portion 21a and the second extension portion 22a increases. Accordingly, the strain gauge 23d attached to the first extension portion 21a and the second extension portion 22a may stretch, thereby increasing resistance, and the resistance may be measured to precisely measure magnitude of acceleration.

The sensing portion 23 may include the first strain gauge disposed on the first extension portion 21a and the second strain gauge disposed on the second extension portion 22a; however, there may be a case in which only one selected from the first extension portion 21a and the second extension portion 22a includes a strain gauge. That is, various modifications are possible.

However, the configuration of the sensing portion 23 is not necessarily limited thereto. For example, as shown in FIG. 5 which is a cross-sectional view schematically illustrating a sensor according to another embodiment of the present disclosure, the sensing portion 23 may include a piezoelectric device 23e interposed between the first extension portion 21a and the second extension portion 22a, and a voltage measuring portion 23b' for measuring a voltage generated by the piezoelectric device 23e.

The piezoelectric device 23e may generate a voltage when mechanical stress is applied thereto. If the first extension portion 21a and the second extension portion 22a are deformed such that they apply stress to the piezoelectric device 23e interposed between the first extension portion 21a and the second extension portion 22a, magnitude of the stress applied to the piezoelectric device 23e may change according to a degree of the deformation. If the magnitude of the stress applied to the piezoelectric device 23e changes, magnitude of a voltage generated by the piezoelectric device 23e may change. Accordingly, a degree of deformation of the first extension portion 21a and the second extension portion 22a can be recognized according to the magnitude of a voltage measured by the voltage measuring portion 23b', and acceleration or magnitude of acceleration can be determined based on the degree of deformation.

Figure 5:
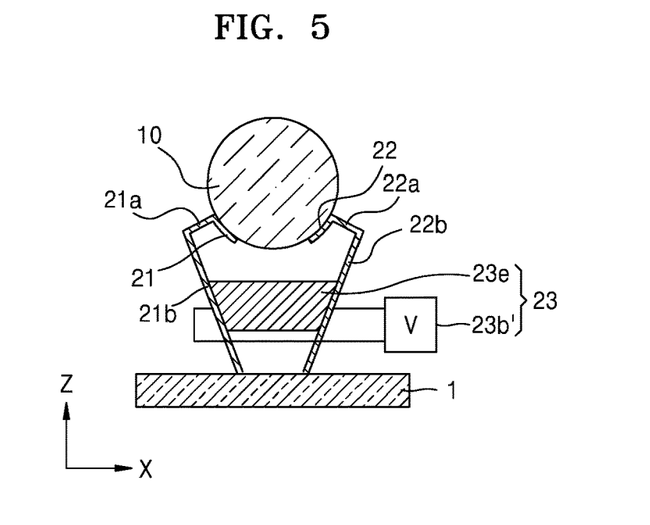
FIG. 5 is a cross-sectional view schematically illustrating a sensor according to another embodiment of the present disclosure.

In the case of the sensor shown in FIG. 5, if the sensor or an object mounted with the sensor undergoes an accelerated motion in the positive (+) z direction, the head 10 may move in the negative (−) z direction, and the first extension portion 21a and the second extension portion 22a that are flexible may be deformed according to the movement of the head 10 such that the distance between the first extension portion 21a and the second extension portion 22a increases. Accordingly, tensile stress may be applied to the piezoelectric device 23e interposed between the first extension portion 21a and the second extension portion 22a, and the voltage measuring portion 23b' may measure the magnitude of a voltage generated by the piezoelectric device 23e according to the magnitude of the tensile stress, to thereby precisely measure the magnitude of acceleration.

However, the piezoelectric device 23e may not necessarily be interposed only between the first extension portion 21a and the second extension portion 22a. For example, in the side view of FIG. 5, at least one portion or the entirety of space defined by the head 10, the first support portion 21, the first extension portion 21a, the first additional extension portion 21b, the second support portion 22, the second extension portion 22a, the second additional extension portion 22b, and the base 1 may be filled with the piezoelectric device 23e. Alternatively, the piezoelectric device 23e may be located between the head 10 and the first support portion 21 or between the head 10 and the second support portion 22 to generate a voltage whose magnitude varies depending on a change in pressure transferred from the head 10. These configurations may be applied to embodiments and modified examples which will be described later.

In the case of the sensing portion 23 described above with reference to FIGS. 2 to 5, whether the first extension portion 21a and/or the second extension portion 22a is deformed or a degree of deformation of the first extension portion 21a and/or the second extension portion 22a may be sensed based on the electrical conductance of at least one portion of the first and second extension portions 21a and 22a and the first and second support portions 21 and 22. Accordingly, the head 10 may include a non-conductive material such as an insulating resin, etc. Alternatively, at least a part of the surface of the head 10 may be coated with a non-conductive material. The non-conductive material may be, for example, an insulating material, a lubricant, or an adhesive. Herein, the at least the part of the surface of the head 10 may include areas which the first support portion 21 and the second support portion 22 contact.

In FIG. 5, the first extension portion 21a and the second extension portion 22b are shown in the positive (+) x direction and the negative (−) x direction with respect to the z axis, however, extension portions may be added in the positive (+) y direction and the negative (−) y direction with respect to the z axis so that the support has four extension portions in total, and support portions located at the ends of the extension portions support the head 10. In this case, the individual extension portions may be deformed in different manners when acceleration is applied in an arbitrary direction such that the deformation can be measured by the above-described measurement method. However, the support may include a total of three extension portions, and support portions formed at the ends of the extension portions may support the head 10. That is, various modifications are possible.

Through the sensor of the simple structure having the head 10 and the flexible support 20, it is possible to precisely and quickly sense acceleration, and to precisely and quickly measure magnitude of acceleration.

Figure 6:
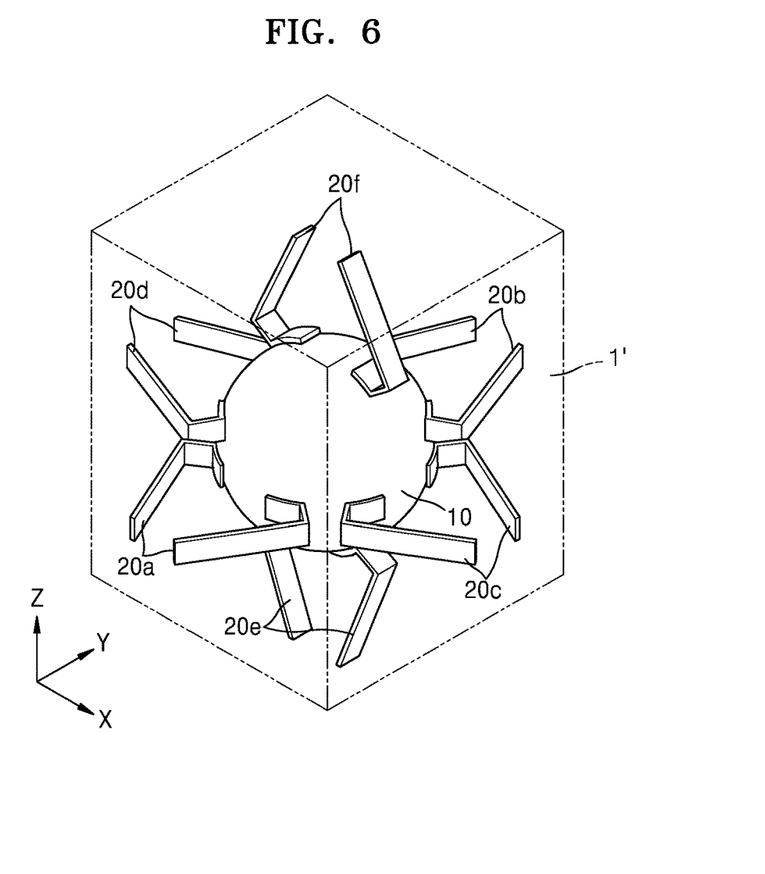
FIG. 6 is a perspective view schematically illustrating a sensor according to another embodiment of the present disclosure.

FIG. 6 is a perspective view schematically illustrating a sensor according to another embodiment of the present disclosure. The sensor according to the current embodiment may include a plurality of supports 20 according to at least one of the embodiments described above with reference to FIGS. 1 to 5. FIG. 6 shows a case in which six supports 20*a* to 20*f* are provided. The supports 20*a* to 20*f* may contact the head 10 at different locations to support the head 10. The sensor may include a hollow receptor 1', and one end of each of the plurality of supports 20*a* to 20*f* may be fixed onto an inner surface of the receptor 1'.

Since the sensor has the plurality of supports 20*a* to 20*f*, the sensor may precisely and quickly sense acceleration in various directions, and precisely and quickly measure magnitude of acceleration. For example, the sensor can precisely and quickly sense acceleration and magnitude of acceleration through the support 20*a* and/or the support 20*b* if the sensor or an object mounted with the sensor undergoes an accelerated motion in the y-axis direction, through the support 20*c* and/or the support 20*d* if the sensor or an object mounted with the sensor undergoes an accelerated motion in the x-axis direction, and through the support 20*e* and/or support 20*f* if the sensor or an object mounted with the sensor undergoes an accelerated motion in the z-axis direction.

In FIG. 6, the receptor 1' is shown as a hexahedron; however, the present disclosure is not limited thereto. For example, the receptor 1' may be a tetrahedron. That is, various modifications are possible. If the receptor 1' is a tetrahedron, the sensor may have four supports.

Figure 7:
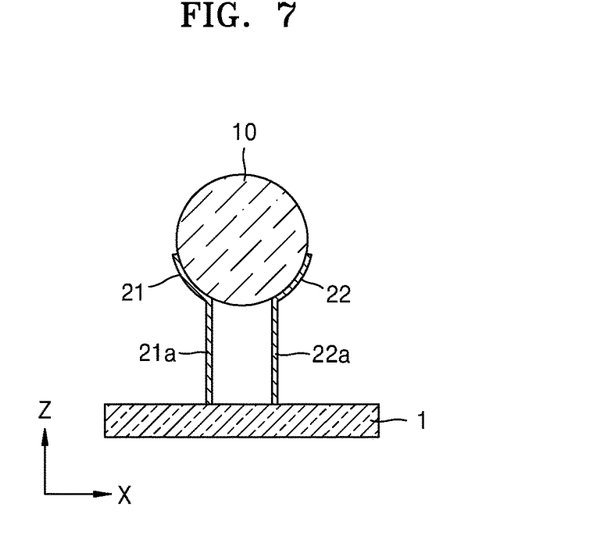
FIG. 7 is a cross-sectional view schematically illustrating a sensor according to another embodiment of the present disclosure.

FIG. 7 is a cross-sectional view schematically illustrating a sensor according to another embodiment of the present disclosure. In FIGS. 1 to 5, the support 20 has the first support portion 21, the second support portion 22, the first extension portion 21*a*, the second extension portion 22*a*, the first additional extension portion 21*b*, and the second additional extension portion 22*b*, however, the first additional extension portion 21*b* may be a portion of the first extension portion 21*a* and the second additional extension portion 22*b* may be a portion of the second extension portion 22*a*, as described above. FIG. 7 shows a similar case, in which the first extension portion 21*a* and the second extension portion 22*a* are directly connected to the base 1. Meanwhile, in FIGS. 1 to 5, an end of the first support portion 21 faces the base 1, and an end of the second support portion 22 faces the base 1. However, as shown in FIG. 7, an end of the first support portion 21 may face in a direction away from the base 1, and an end of the second support portion 22 may also face in the direction away from the base 1. However, in this case, likewise, the first support portion 21 and the second support portion 22 may extend along the surface of the head 10.

In the sensor according to the current embodiment, the sensing portion (not shown) may sense a change in distance between the first extension portion 21*a* and the second extension portion 22*a* according to movement of the head 10, to thereby precisely and quickly sense acceleration and to precisely and quickly measure magnitude of acceleration. The configuration of the sensing portion (not shown) may be the same as that described above with reference to FIGS. 2 to 5.

Figure 8:
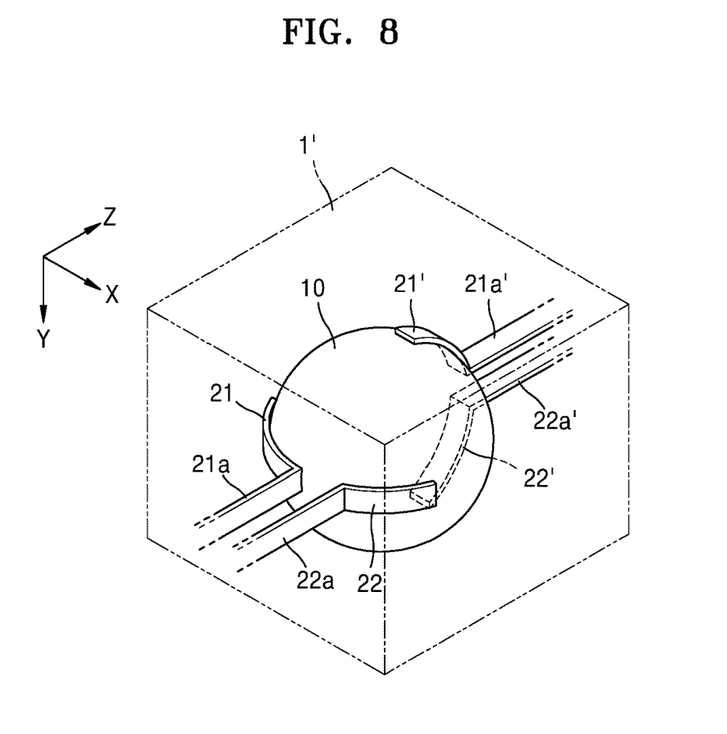
FIG. 8 is a perspective view schematically illustrating a sensor according to another embodiment of the present disclosure.

FIG. 8 is a perspective view schematically illustrating a sensor according to another embodiment of the present disclosure. The sensor according to the current embodiment may have two supports, like the sensor according to the embodiment described above with reference to FIG. 7. Referring to FIG. 8, a first support of the two supports may have a first extension portion 21*a* and a second extension portion 22*a* extending in the z-axis direction, and a first support portion 21 and a second support portion 22 surrounding the head 10 on the z-x plane. A second support may have a third extension portion 21*a*' and a fourth extension portion 22*a*' extending in the z-axis direction, and a third support portion 21' and a fourth support portion 22' surrounding the head 10 on the y-z plane. The first support portion 21 to the fourth support portion 22' may be fixed onto an inner surface of the receptor 1'. A sensing portion (not shown) disposed between the first extension portion 21*a* and the second extension portion 22*a*, and a sensing portion (not shown) disposed between the third extension portion 21*a*' and the fourth extension portion 22*a*' may have the same configuration as that of the sensing portion 23 described above with reference to FIGS. 2 to 5.

The sensor according to the current embodiment as described above can precisely and quickly sense acceleration in various directions, and precisely and quickly measure magnitude of acceleration. For example, the sensor can precisely and quickly sense acceleration and magnitude of acceleration through the first extension portion 21*a* and the second extension portion 22*a* if the sensor or an object mounted with the sensor undergoes an accelerated motion in the x-axis direction, and through the third extension portion 21*a*' and the fourth extension portion 22*a*' if the sensor or an object mounted with the sensor undergoes an accelerated motion in the y-axis direction. If the sensor or an object mounted with the sensor undergoes an accelerated motion in the positive (+) z-axis direction, the sensor may precisely and quickly sense acceleration and magnitude of acceleration through the first extension portion 21*a* and the second extension portion 22*a*, and if the sensor or an object mounted with the sensor undergoes an accelerated motion in the negative (−) z-axis direction, the sensor may precisely and quickly sense acceleration and magnitude of acceleration through the third extension portion 21*a*' and the fourth extension portion 22*a*'.

Figure 9:
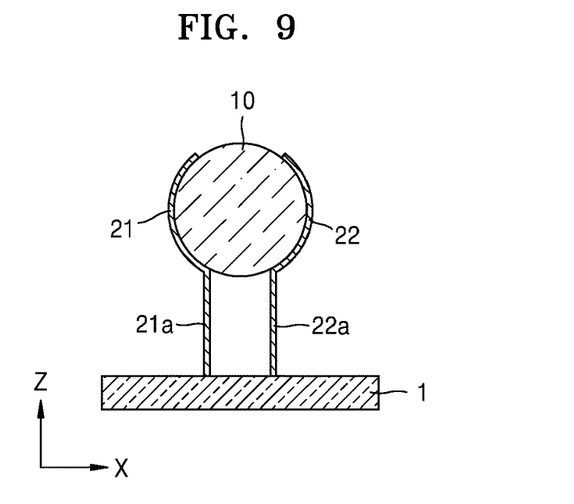
FIG. 9 is a cross-sectional view schematically illustrating a sensor according to another embodiment of the present disclosure.

Meanwhile, unlike FIG. 7, as shown in FIG. 9, if the first support portion 21 and the second support portion 22 extend further away from the base 1 to surround the head 10 over a wider area, the head 10 may be effectively prevented from escaping from the first support portion 21 and the second support portion 22.

Figure 10:
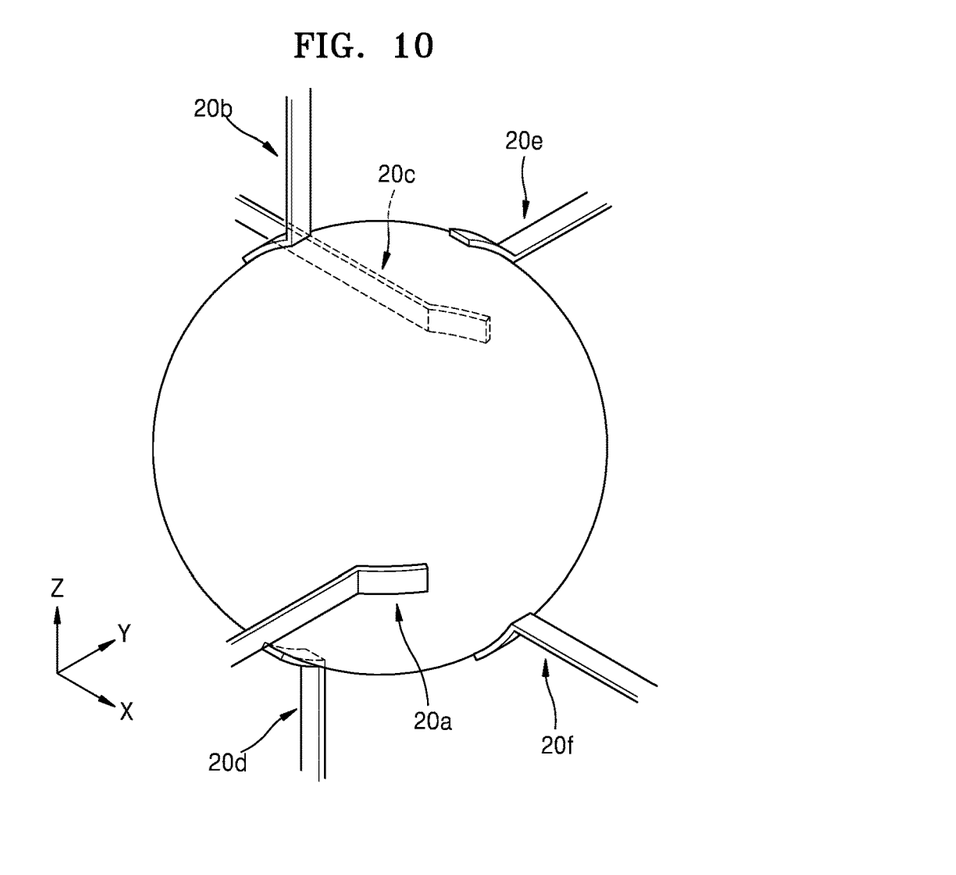
FIG. 10 is a perspective view schematically illustrating a sensor according to another embodiment of the present disclosure.

FIG. 10 is a perspective view schematically illustrating a sensor according to another embodiment of the present disclosure. The sensor according to the current embodiment may include the head 10 and a plurality of supports 20*a* to 20*f*. In FIG. 10, six supports 20*a* to 20*f* are shown. Each of the plurality of supports 20*a* to 20*f* may include a support portion supporting the head 10, an extension portion extending from the support portion, and a sensing portion for sensing deformation of the extension portion. Herein, the sensing portion may include a strain gauge described above.

In the plurality of supports 20*a* to 20*f*, the extension portions may extend in different directions as shown in FIG. 10. The extension portion of the support 20*a* may extend in the negative (−) y direction, the extension portion of the support 20*b* may extend in the positive (+) z direction, the extension portion of the support 20*c* may extend in the negative (−) x direction, the extension portion of the support 20*d* may extend in the negative (−) z direction, the extension portion of the support 20*e* may extend in the positive (+) y direction, and the extension portion of the support 20*f* may extend in the positive (+) x direction. The plurality of supports 20*a* to 20*f* may also be flexible. Additionally, each of the plurality of supports 20*a* to 20*f* may be fixed onto an inner surface of a receptor (not shown).

The sensor according to the current embodiment may precisely and quickly sense acceleration in various directions, and precisely and quickly measure magnitude of acceleration. For example, the sensor may precisely and quickly sense and measure acceleration and magnitude of acceleration through the support 20a if the sensor or an object mounted with the sensor undergoes an accelerated motion in the positive (+) x direction, through the support 20a or through the support 20a and the support 20f if the sensor or an object mounted with the sensor undergoes an accelerated motion in the negative (−) x direction, through the support 20d or through the support 20d and the support 20a if the sensor or an object mounted with the sensor undergoes an accelerated motion in the positive (+) y direction, through the support 20c or through the support 20c and the support 20e if the sensor or an object mounted with the sensor undergoes an accelerated motion in the negative (−) y direction, through the support 20f or through the support 20f and the support 20d if the sensor or an object mounted with the sensor undergoes an accelerated motion in the positive (+) z direction, and through the support 20e or through the support 20e and the support 20b if the sensor and an object mounted with the sensor undergoes an accelerated motion in the negative (−) z direction.

The sensing portion may have a function of measuring capacitance, instead of a strain gauge. For example, the plurality of supports 20a to 20f may have conductivity for use as electrodes of a capacitor, and at least a part of an inner surface of the receptor (not shown) may have conductivity for use as electrodes of a capacitor. Through this configuration, by considering the plurality of supports 20a to 20f and the at least the part of the inner surface of the receptor as electrodes for sensing a change in capacitance, it is possible to sense any deformation of the extension portions. For example, the extension portion of the support 20a may be considered to be an electrode, and a change in capacitance between the support 20a and the inner surface of the receptor positioned on an y-z plane in the positive (+) x direction may be sensed. Alternatively, the extension portion of the support 20a may be considered to be an electrode, and a change in capacitance between the support 20a and the inner surface of the receptor positioned on a y-z plane in the negative (−) x direction may be sensed.

However, the sensing portion may measure inductance, instead of capacitance. For example, the plurality of supports 20a to 20f may have conductivity, and one end of a coil may be connected to the plurality of supports 20a to 20f. Also, at least a part of the inner surface of the receptor (not shown) may have conductivity, and the other end of the coil may be connected to the at least the part of the inner surface of the receptor. Thereby, a change in inductance may be sensed to sense deformation of the extension portion. For example, a coil may be interposed between the extension portion of the support 20a and the inner surface of the receptor which is positioned on a y-z plane in the positive (+) x direction, and a change in inductance of the coil may be sensed. Alternatively, a coil may be interposed between the extension portion of the support 20a and the inner surface of the receptor which is positioned on a y-z plane in the negative (−) x direction, and a change in inductance of the coil may be sensed.

Meanwhile, in the embodiment shown in FIG. 10, a piezoelectric device interposed between each of the plurality of supports 20a to 20f and the head 10 may be included in the sensing portion. Thereby, the sensing portion may sense magnitude of a voltage generated by the piezoelectric device. In this case, although the sensing portion senses the magnitude of a voltage according to a change in pressure between the head 10 and the plurality of supports 20a to 20f, it may be understood that the sensing portion senses deformation of the extension portions according to movement of the head 10. The reason for this is that a change in pressure between the head 10 and the plurality of supports 20a to 20f results in deformation of the extension portions.

Figure 11:
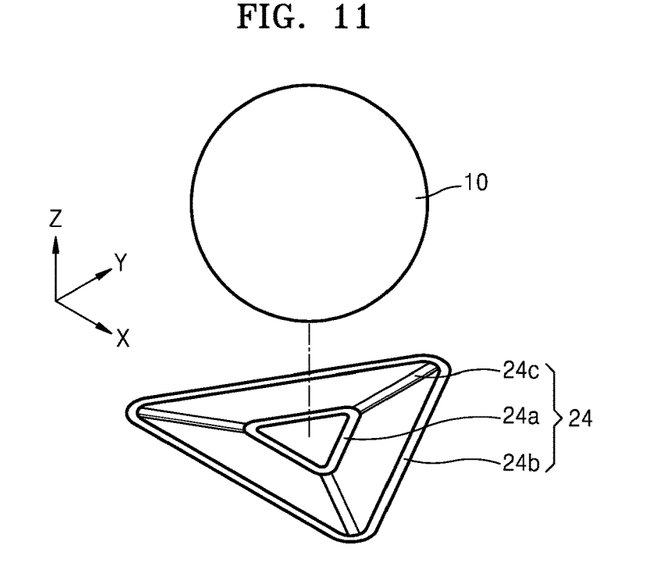
FIG. 11 is an exploded perspective view schematically illustrating a sensor according to another embodiment of the present disclosure.

FIG. 11 is an exploded perspective view schematically illustrating a sensor according to another embodiment of the present disclosure. The sensor according to the current embodiment may include the head 10, and a support 24 disposed to support one side of the head 10. In FIG. 11, the head 10 is shown to be spaced apart from the support 24 for convenience of description; however, the head 10 may contact the support 24.

The support 24 may include a support portion 24a supporting the head 10, a frame 24b spaced apart from the support portion 24a, a plurality of flexible connecting portions 24c which connect the support 24a to the frame 24b, and a sensing portion (not shown) for sensing deformation of the plurality of connecting portions 24c. The sensing portion may include a strain gauge as described above. If the head 10 is in the shape of a sphere, the support portion 24a may be in the form of a closed loop having a polygonal ring shape, such as a triangular ring or a quadrangular ring. In FIG. 11, the frame 24b is shown in the form of a triangular ring; however, the present disclosure is not limited thereto. The frame 24b may be in the form of a closed loop having a polygonal ring shape such as a quadrangular ring.

The sensor may also sense acceleration and measure magnitude of acceleration. For example, if the sensor or an object mounted with the sensor undergoes an accelerated motion in the positive (+) z direction, the head 10 may move in the negative (−) z direction, and the plurality of flexible connecting portions 24c may be deformed according to the movement of the head 10. The sensing portion may sense the deformation. Accordingly, the sensor may sense acceleration and/or magnitude of acceleration. The plurality of flexible connecting portions 24c may be formed of a conductive metal and/or a synthetic resin. The support portion 24a and the frame 24b may be formed of an arbitrary material having firmness, such as a metal.

However, the sensing portion may have a function of measuring capacitance, instead of a strain gauge. For example, the connecting portions 24c may have conductivity to be used as electrodes of a capacitor, and at least a part of the inner surface of a receptor (not shown) may have conductivity for use as electrodes of a capacitor. Through this configuration, by considering the connecting portions 24c and the at least the part of the inner surface of the receptor as electrodes for sensing a change in capacitance, it is possible to sense any deformation of the connecting portions 24c. For example, the connecting portions 24c may be considered to be electrodes, and a change in capacitance between the connecting portions 24c and the inner surface of the receptor which is positioned on an x-y plane in the negative (−) z direction may be sensed.

The sensing portion may measure inductance, instead of capacitance. For example, the connecting portions 24c may have conductivity, and one end of a coil may be connected to the connecting portions 24c. Also, at least a part of an inner surface of a receptor (not shown) may have conductivity, and the other end of the coil may be connected to the at least the part of the inner surface of the receptor. Thereby, a change in inductance may be sensed to sense deformation of the connecting portions 24c. For example, a coil may be interposed between the connecting portions 24c and the inner surface of the receptor which is positioned on an x-y plane in the negative (−) z direction, and a change in inductance of the coil may be sensed.

As a modified example, in the embodiment of FIG. 11, a piezoelectric device interposed between the support portions 24a and the head 10 may be included in the sensing portion. Thereby, the sensing portion may sense magnitude of a voltage generated by the piezoelectric device. In this case, although the sensing portion senses the magnitude of a voltage according to a change in pressure between the head 10 and the support portions 24a, it may be understood that the sensing portion senses deformation of the plurality of connecting portions 24c, according to movement of the head 10. The reason for this is that a change in pressure between the head 10 and the support portions 24a results in deformation of the plurality of connecting portions 24c.

However, as shown in FIG. 6, the sensor may include a plurality of supports 24. That is, as shown in FIG. 6, the sensor may include six supports 24 disposed in the positive (+) x direction, the negative (−) x direction, the positive (+) y direction, the negative (−) y direction, the positive (+) z direction, and the negative (−) z direction with respect to the head 10. The six supports 24 may contact the head 10 at different locations to support the head 10. The sensor may include a hollow receptor, and each of the six supports 24 may be fixed on an inner surface of the receptor.

Since the sensor has the six supports 24, the sensor may precisely and quickly sense acceleration in various directions, and precisely and quickly measure magnitude of acceleration.

Figure 12:
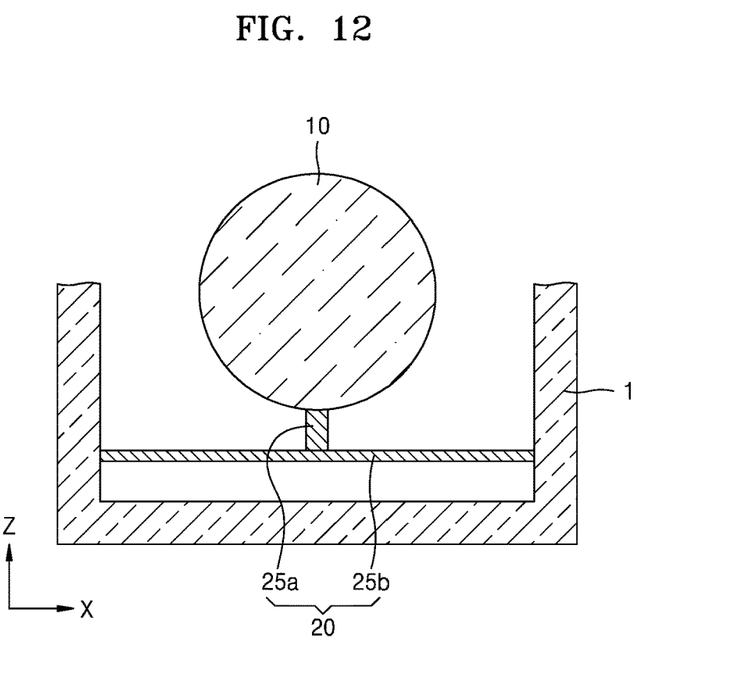
FIG. 12 is a cross-sectional view schematically illustrating a sensor according to another embodiment of the present disclosure.

FIG. 12 is a cross-sectional view schematically illustrating a sensor according to another embodiment of the present disclosure. The sensor according to the current embodiment may include the head 10, and the support 20 disposed so as to support one side of the head 10.

The support 20 may include a support portion 25a supporting the head 10, a flexible frame 25b contacting the support portion 25a, and a sensing portion (not shown) for sensing deformation of the frame 25b. The sensing portion may include a strain gauge as described above. The flexible frame 25b may extend in one direction, and two ends of the flexible frame 25b may be fixed onto the base 1. One end of the support portion 20 may support the head 10, and another end of the support portion 20 may be located on the flexible frame 25b. The flexible frame 25b may be formed of a conductive metal and/or a synthetic resin.

The sensor may sense acceleration and measure magnitude of acceleration. For example, if the sensor or an object mounted with the sensor undergoes an accelerated motion in the positive (+) z direction, the head 10 may move in the negative (−) z direction, and the flexible frame 25b may be deformed according to the movement of the head 10. The sensing portion may sense the deformation according to the method described above with reference to FIGS. 1 to 6. Accordingly, the sensor may sense acceleration and/or magnitude of acceleration.

In the configuration shown in FIG. 12, the sensing portion may not necessarily include a strain gauge. For example, a conductive coil may be interposed between the flexible frame 25b and a side or lower surface of the base 1 such that a change in inductance can be measured to sense acceleration and/or magnitude of acceleration. Capacitance formed between the flexible frame 25b and the side or lower surface of the base 1 may be measured to sense acceleration and/or magnitude of acceleration. That is, the sensing portion may have various configurations.

Also, a piezoelectric device interposed between the head 10 and the support portion 25a may be included in the sensing portion. In this case, although the sensing portion senses magnitude of a voltage according to a change in pressure between the head 10 and the support portion 25a, it can be understood that the sensing portion senses deformation of the frame 25b according to movement of the head 10. The reason for this is that a change in pressure between the head 10 and the support portion 25a results in deformation of the frame 25b.

Figure 13:
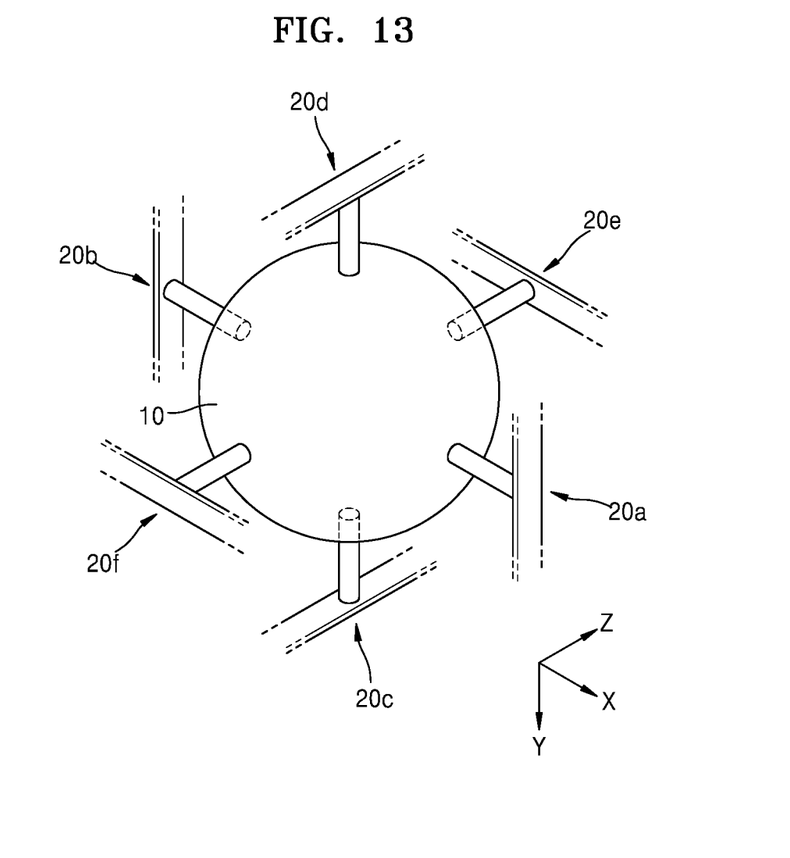
FIG. 13 is a perspective view schematically illustrating a sensor according to another embodiment of the present disclosure.

Also, as shown in FIG. 13, the sensor may include a plurality of supports 20a to 20f. That is, as shown in FIG. 13, the sensor may include six supports 20a to 20f disposed in the positive (+) x direction, the negative (−) x direction, the positive (+) y direction, the negative (−) y direction, the positive (+) z direction, and the negative (−) z direction with respect to the head 10. The six supports 20a to 20f may contact the head 10 at different locations to support the head 10. The sensor may include a hollow receptor, and each of the six supports 20a to 20f may be fixed onto an inner surface of the receptor.

Since the sensor has the six supports 20a to 20f, the sensor may precisely and quickly sense acceleration in various directions, and precisely and quickly measure magnitude of acceleration.

So far, a case in which the sensor senses acceleration or measures magnitude of acceleration has been described; however, the functions of the sensor according to the present disclosure are not limited thereto. For example, when an impact or a force is applied from the outside, the position of the head 10 may be changed by inertia, and as a result, the extension portions may be deformed. Accordingly, the sensor may sense the deformation of the extension portions to sense the impact or the force applied from the outside, and to measure magnitude of the impact or the force. Also, when the sensor according to the present disclosure shakes due to a vibration, the extension portions may be deformed. Accordingly, the sensor may be used to sense such a vibration and measure magnitude of the vibration. That is, the sensor according to the present disclosure may be used to measure acceleration, an impact or a force, pressure, a vibration, etc. Also, since the extension portions of the sensor may expand or contract according to a change in temperature, the sensor may sense deformation of the extension portions due to the expansion/contraction of the extension portions, to thereby detect a temperature gradient or to measure a degree of a temperature gradient. Also, if a sensing portion such as a piezoelectric device is disposed between the head and the support portion, the sensor may be used to detect, when an impact or a force from the outside is applied to the sensor or when the sensor shakes due to a vibration, the impact, the force, or the vibration, and to measure magnitude of the impact, the force, or the vibration.

In summary, the sensor according to the present disclosure may measure all physical variables including, for example, a force, a vibration, acceleration, and temperature, which change the structure or form of the sensor head 10, the support portions 21 and 22, the extension portions 21a, 21b, 22a, and 22b, the frames 24 and 25, the base 1, etc., or the form of space formed between them. Furthermore, the numbers of the support portions 21 and 22, the extension portions 21a 21b, 22a, and 22b, and/or the sensing portions attached or connected to the sensor may increase so that forces, acceleration, vibrations, temperature, etc. in various directions may be measure simultaneously. Accordingly, the sensor may be used as a device capable of simultaneously measuring physical variables in various directions, including a multi-axis load cell, a multi-axis accelerometer, a multi-axis vibroscope, a multi-axis temperature gradient sensor, a multi-axis inertial sensor, etc.

While the present disclosure has been particularly shown and described with reference to example embodiments thereof, various modifications and adaptations will be readily apparent to one of ordinary skill in the art without departing from the spirit and scope of the present disclosure.

INDUSTRIAL APPLICABILITY

According to an embodiment of the present disclosure configured as described above, a sensor having a simple structure and capable of sensing motion precisely is provided.

The invention claimed is:

1. A sensor comprising:
a head; and
a support disposed to support one side of the head,
wherein the support comprises:
a first support portion supporting the head;
a second support portion supporting the head and spaced apart from the first support portion;
a first extension portion extending from the first support portion;
a second extension portion extending from the second support portion; and
a sensing portion configured to sense deformation of the first extension portion and the second extension portion,
wherein at least one of the first extension portion or the second extension portion includes a conductive material, and the sensing portion considers the at least one of the first extension portion and the second extension portion including the conductive material as an electrode to sense a change in capacitance, to thereby sense a change in distance between the first extension portion and the second extension portion.

2. The sensor according to claim 1, wherein the sensing portion comprises a strain gauge.

3. The sensor according to claim 1, wherein the sensing portion comprises a first strain gauge disposed on the first extension portion, and a second strain gauge disposed on the second extension portion.

4. The sensor according to claim 1, wherein the sensing portion comprises:
a piezoelectric device interposed between the first extension portion and the second extension portion, between the first support portion and the head, or between the second support portion and the head; and
a voltage measuring portion configured to measure a voltage generated by the piezoelectric device.

5. The sensor according to claim 1, wherein the head includes a non-conductive material.

6. The sensor according to claim 1, wherein at least a part of a surface of the head is coated with a non-conductive material.

7. The sensor according to claim 1, wherein the support is flexible.

8. The sensor according to claim 1, wherein a distance between the first support portion and the second support portion is shorter than a thickness of a thickest portion of the head.

9. The sensor according to claim 1, comprising a plurality of supports, wherein the plurality of supports contact the head at different locations to support the head.

10. The sensor according to claim 9, further comprising a hollow receptor, wherein each of the plurality of supports is fixed onto an inner surface of the receptor.

11. The sensor according to claim 1, wherein the sensing portion comprises:
a voltage applying portion configured to apply an alternating-current voltage between the first extension portion and the second extension portion; and
a current measuring portion configured to measure current flowing between the first extension portion and the second extension portion.

12. A sensor comprising:
a head; and
a support disposed to support one side of the head,
wherein the support comprises:
a first support portion supporting the head;
a second support portion supporting the head and spaced apart from the first support portion;
a first extension portion extending from the first support portion;
a second extension portion extending from the second support portion; and
a sensing portion configured to sense deformation of the first extension portion and the second extension portion,
wherein at least one of the first extension portion or the second extension portion includes a conductive material and is connected to a coil, and the sensing portion senses a change in inductance of the coil to sense a change in distance between the first extension portion and the second extension portion.

13. The sensor according to claim 12, wherein the sensing portion comprises:
a voltage applying portion configured to apply an alternating-current voltage between the first extension portion and the second extension portion; and
a current measuring portion configured to measure current flowing between the first extension portion and the second extension portion.

14. A sensor comprising:
a head; and
a plurality of supports contacting the head at different locations and supporting the head,
wherein each of the plurality of supports comprises:
a support portion supporting the head;
an extension portion extending from the support portion; and
a sensing portion configured to sense deformation of the extension portion,
wherein the sensor further comprises a hollow receptor,
wherein each of the plurality of supports is fixed onto an inner surface of the receptor,
wherein the extension portions of the plurality of supports extend in different directions,
wherein the sensing portion considers the plurality of supports and at least a part of the inner surface of the receptor as electrodes to sense a change in capacitance, to thereby sense deformation of the extension portion.

15. The sensor according to claim 14, wherein the sensing portion comprises a strain gauge disposed on the extension portion, or a piezoelectric device interposed between the head and the support portion.

16. The sensor according to claim 14, wherein the plurality of supports are flexible.

17. A sensor comprising:
a head; and
a plurality of supports contacting the head at different locations and supporting the head
wherein each of the plurality of supports comprises:
a support portion supporting the head;

an extension portion extending from the support portion; and a sensing portion configured to sense deformation of the extension portion, wherein the sensor further comprises a hollow receptor, wherein each of the plurality of supports is fixed onto an inner surface of the receptor, wherein the extension portions of the plurality of supports extend in different directions, wherein the plurality of supports are connected to the inner surface of the receptor by a coil, and the sensing portion senses a change in inductance of the coil to sense deformation of the extension portion.

18. A sensor comprising:

a head; and a plurality of supports, wherein the plurality of supports contact the head at different locations to support the head, wherein each of the supports comprises:

a support portion supporting the head;

a frame spaced apart from the support portion;

a plurality of connecting portions connecting the support portion to the frame, the connecting portions being flexible; and a sensing portion configured to sense deformation of the plurality of connecting portions, wherein the sensor further comprises a hollow receptor, wherein each of the plurality of supports is fixed onto an inner surface of the receptor, and wherein the sensing portion considers the plurality of supports and at least a part of the inner surface of the receptor as electrodes to sense a change in capacitance, to thereby sense deformation of the plurality of connecting portions.

19. The sensor according to claim 18, wherein the sensing portion comprises a strain gauge disposed on the plurality of connecting portions, or a piezoelectric device interposed between the head and the support portion.

20. A sensor comprising:

a head; and a plurality of supports, wherein the plurality of supports contact the head at different locations to support the head, wherein each of the supports comprises:

a support portion supporting the head;

a frame spaced apart from the support portion;

a plurality of connecting portions connecting the support portion to the frame, the connecting portions being flexible; and a sensing portion configured to sense deformation of the plurality of connecting portions, wherein the sensor further comprises a hollow receptor, wherein each of the plurality of supports is fixed onto an inner surface of the receptor, and wherein the plurality of supports are connected to the inner surface of the receptor by a coil, and the sensing portion senses a change in inductance of the coil to sense deformation of the plurality of connecting portions.

21. A sensor comprising:

a head; and a support disposed to support one side of the head, wherein the support comprises:

a support portion supporting the head;

a frame spaced apart from the support portion;

a plurality of connecting portions connecting the support portion to the frame, the connecting portions being flexible; and a sensing portion configured to sense deformation of the plurality of connecting portions, wherein each of the support portion and the frame is in the form of a closed loop.

22. The sensor according to claim 21, wherein the sensing portion comprises a strain gauge disposed on the frame, or a piezoelectric device interposed between the head and the support.

23. A sensor comprising:

a head; and a plurality of supports, wherein the plurality of supports contact the head at different locations to support the head, wherein the support comprises:

a support portion supporting the head;

a frame which is flexible and contacting the support portion; and a sensing portion configured to sense deformation of the frame, wherein the sensor further comprises a hollow receptor, wherein each of the plurality of supports is fixed onto an inner surface of the receptor, wherein the sensing portion considers the plurality of supports and at least a part of the inner surface of the receptor as electrodes to sense a change in capacitance, to thereby sense deformation of the frame.

24. A sensor comprising:

a head; and a plurality of supports, wherein the plurality of supports contact the head at different locations to support the head, wherein the support comprises:

a support portion supporting the head;

a frame which is flexible and contacting the support portion; and a sensing portion configured to sense deformation of the frame, wherein the sensor further comprises a hollow receptor, wherein each of the plurality of supports is fixed onto an inner surface of the receptor, wherein the plurality of supports are connected to the inner surface of the receptor by a coil, and the sensing portion senses a change in inductance of the coil to sense deformation of the frame.

* * * * *